US011295602B2

(12) United States Patent
Jayaraman

(10) Patent No.: US 11,295,602 B2
(45) Date of Patent: Apr. 5, 2022

(54) SYSTEM AND METHOD FOR PROVIDING ENHANCED SECURITY OF PHYSICAL ASSETS WITHIN A PHYSICAL INFRASTRUCTURE

(71) Applicant: Wipro Limited, Bangalore (IN)

(72) Inventor: Venkata Subramanian Jayaraman, Chennai (IN)

(73) Assignee: Wipro Limited, Bangalore (IN)

(*) Notice: Subject to any disclaimer, the term of this patent is extended or adjusted under 35 U.S.C. 154(b) by 79 days.

(21) Appl. No.: 16/835,591

(22) Filed: Mar. 31, 2020

(65) Prior Publication Data

US 2021/0304587 A1    Sep. 30, 2021

(30) Foreign Application Priority Data

Mar. 27, 2020 (IN) .............................. 202041013522

(51) Int. Cl.
| | |
|---|---|
| *G08B 13/14* | (2006.01) |
| *G08B 29/18* | (2006.01) |
| *G06F 9/54* | (2006.01) |
| *G06Q 50/26* | (2012.01) |
| *G01S 5/20* | (2006.01) |
| *G06F 30/10* | (2020.01) |

(Continued)

(52) U.S. Cl.
CPC .............. *G08B 29/185* (2013.01); *G01S 5/20* (2013.01); *G06F 9/542* (2013.01); *G06F 30/10* (2020.01); *G06K 7/10366* (2013.01); *G06N 20/00* (2019.01); *G06Q 50/265* (2013.01); *G08B 13/1681* (2013.01)

(58) Field of Classification Search
CPC combination set(s) only.
See application file for complete search history.

(56) References Cited

U.S. PATENT DOCUMENTS

| | | | | |
|---|---|---|---|---|
| 8,989,053 B1* | 3/2015 | Skaaksrud | ........... | G06Q 20/308 370/255 |
| 10,729,502 B1* | 8/2020 | Wolf | ...................... | G06N 20/00 |

(Continued)

OTHER PUBLICATIONS

Antonacci, F., et al., "Audio-based object recognition system for tangible acoustic interfaces", IEEE 2009, 7 pages.

(Continued)

*Primary Examiner* — Julie B Lieu
(74) *Attorney, Agent, or Firm* — Finnegan, Henderson, Farabow, Garrett & Dunner, LLP

(57) ABSTRACT

The disclosure relates to a system and method for providing enhanced security of physical assets within a physical infrastructure. The method includes receiving an overall layout of the physical infrastructure and multi-modal input with respect to the physical asset from a plurality of sensors installed within the physical infrastructure. The multi-modal input includes acoustic signal generated by or reflected off the physical asset and captured by a set of acoustic sensors. The method further includes generating a digital asset corresponding to the physical asset by determining an identification, a location, a shape, a size, and a behavior of the physical asset based on the multi-modal input and the overall layout, detecting one or more events of interest involving the digital asset based on the behavior of the physical asset, and simulating the one or more events of interest to evaluate a possible fault or a possible security threat.

17 Claims, 7 Drawing Sheets

(51) Int. Cl.
*G06N 20/00* (2019.01)
*G08B 13/16* (2006.01)
*G06K 7/10* (2006.01)

(56) References Cited

U.S. PATENT DOCUMENTS

| | | | | |
|---|---|---|---|---|
| 10,878,454 | B2* | 12/2020 | Appakutty | G06Q 30/0261 |
| 11,024,105 | B1* | 6/2021 | Brand | G07C 9/10 |
| 2006/0265664 | A1* | 11/2006 | Simons | G01S 5/0221 |
| | | | | 715/772 |
| 2015/0112883 | A1* | 4/2015 | Orduna | H04L 67/12 |
| | | | | 705/325 |
| 2015/0276238 | A1* | 10/2015 | Matsuoka | G05D 23/1905 |
| | | | | 700/278 |
| 2017/0173262 | A1* | 6/2017 | Veltz | A61B 5/0022 |
| 2018/0103913 | A1* | 4/2018 | Tzvieli | G06K 9/3233 |
| 2018/0260641 | A1* | 9/2018 | Yadhunandan | G06K 9/00281 |
| 2019/0018939 | A1* | 1/2019 | Lev | H04L 63/1425 |
| 2019/0197896 | A1* | 6/2019 | Bakhishev | G06K 9/00771 |
| 2020/0135028 | A1* | 4/2020 | Bakhishev | G08G 1/042 |
| 2020/0289033 | A1* | 9/2020 | Sivertsen | A61B 5/1117 |
| 2020/0327315 | A1* | 10/2020 | Mullins | G06K 9/00771 |
| 2021/0001174 | A1* | 1/2021 | Kantorovich | G06N 20/00 |
| 2021/0073449 | A1* | 3/2021 | Segev | G06K 9/4604 |
| 2021/0076966 | A1* | 3/2021 | Grantcharov | A61B 5/364 |
| 2021/0232577 | A1* | 7/2021 | Ogawa | G06K 9/00335 |

OTHER PUBLICATIONS

Jiang, R., et al., "Let Blind People See: Real-Time Visual Recognition with Results Converted to 3D Audio", 2016, 7 pages.

Kucukbay, S., et al., "Object Detection Using Acoustic Sensors for Surveillance Applications", IJCCIE vol. 5, issue 1 (2018), pp. 10-13.

Pu, J., et al., "Audio-Visual Object Localization and Separation Using Low-Rank and Sparsity", https://ibug.doc.ic.ac.uk/media/uploads/documents/pu.pdf, 2017, 5 pages.

Vrigas, M., et al., "Identifying Human Behaviors Using Synchronized Audio-Visual Cues", IEEE Transactions on Affective Computing (vol. 8, Issue 5) 2017, 14 pages.

* cited by examiner

SYSTEM AND METHOD FOR PROVIDING ENHANCED SECURITY OF PHYSICAL ASSETS WITHIN A PHYSICAL INFRASTRUCTURE

TECHNICAL FIELD

The present disclosure relates generally to security systems and more particularly to system and method for providing enhanced security of physical assets within a physical infrastructure.

BACKGROUND

Today, various physical infrastructures like a store, an office, and a distribution centers require surveillance for security purpose. Various techniques are available that provide surveillance of physical assets within the physical infrastructure. A most common way of performing surveillance includes use of surveillance cameras. However, these cameras alone do not provide effective results and need to be used in combination with other techniques, particularly at places where a high level of security is required. For example, the cameras are not stealth and give away to the surveillance that is being carried out. Further, for example, the cameras may result in erroneous result due to cluttered backgrounds caused by camera motion or change in illumination and appearance.

Thus, conventional techniques for providing security of physical assets within the physical infrastructure are limited in their scope and utility. In addition to above, convention techniques lack in predicting a possible security failure/threat. Additionally, the conventional techniques lack in dynamic prevention of predicted failures/threats without any human intervention. Conventional techniques, therefore, may not provide a complete picture of a scenario and consume more time to detect a faulty section from a complete infrastructure before recognizing a real time problem that needs to be fixed. Additionally, some of the conventional techniques require huge data for classification to deliver accurate results which is a time taking procedure, and difficult to implement in a real-time environment. In short, the conventional techniques lack in delivering real time scenarios and, thus, face a difficulty of taking dynamic decision for security failure prediction and prevention.

SUMMARY

In one embodiment, a method of providing enhanced security of a physical asset within a physical infrastructure is disclosed. In one example, the method may include receiving an overall layout of the physical infrastructure and multi-modal input with respect to the physical asset from a plurality of sensors installed within the physical infrastructure. The multi-modal input may comprise acoustic signal generated by or reflected off the physical asset and captured by a set of acoustic sensors. The method may further include generating a digital asset corresponding to the physical asset by determining an identification, a location, a shape, a size, and a behavior of the physical asset based on the multi-modal input and the overall layout. The method may further include detecting one or more events of interest involving the digital asset based on the behavior of the physical asset. The method may further include simulating the one or more events of interest to evaluate a possible fault or a possible security threat.

In another embodiment, a system for providing enhanced security of a physical asset within a physical infrastructure is disclosed. In one example, the system may include a processor and a memory communicatively coupled to the processor. The memory may store processor-executable instructions, which, on execution, may causes the processor to receive an overall layout of the physical infrastructure and multi-modal input with respect to the physical asset from a plurality of sensors installed within the physical infrastructure. The multi-modal input may comprise acoustic signal generated by or reflected off the physical asset and captured by a set of acoustic sensors. The processor-executable instructions, on execution, may further cause the processor to generate a digital asset corresponding to the physical asset by determining an identification, a location, a shape, a size, and a behavior of the physical asset based on the multi-modal input and the overall layout. The processor-executable instructions, on execution, may further cause the processor to detect one or more events of interest involving the digital asset based on the behavior of the physical asset. The processor-executable instructions, on execution, may further cause the processor to simulate the one or more events of interest to evaluate a possible fault or a possible security threat.

In yet another embodiment, a non-transitory computer-readable medium storing computer-executable instruction for providing enhanced security of a physical asset within a physical infrastructure is disclosed. In one example, the stored instructions, when executed by a processor, may cause the processor to perform operations including receiving an overall layout of the physical infrastructure and multi-modal input with respect to the physical asset from a plurality of sensors installed within the physical infrastructure. The multi-modal input may comprise acoustic signal generated by or reflected off the physical asset and captured by a set of acoustic sensors. The operations may further include generating a digital asset corresponding to the physical asset by determining an identification, a location, a shape, a size, and a behavior of the physical asset based on the multi-modal input and the overall layout. The operations may further include detecting one or more events of interest involving the digital asset based on the behavior of the physical asset. The operations may further include simulating the one or more events of interest to evaluate a possible fault or a possible security threat.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this disclosure, illustrate exemplary embodiments and, together with the description, serve to explain the disclosed principles.

DETAILED DESCRIPTION

Exemplary embodiments are described with reference to the accompanying drawings. Wherever convenient, the same reference numbers are used throughout the drawings to refer to the same or like parts. While examples and features of disclosed principles are described herein, modifications, adaptations, and other implementations are possible without departing from the spirit and scope of the disclosed embodiments. It is intended that the following detailed description be considered as exemplary only, with the true scope and spirit being indicated by the following claims. Additional illustrative embodiments are listed below.

Figure 1:
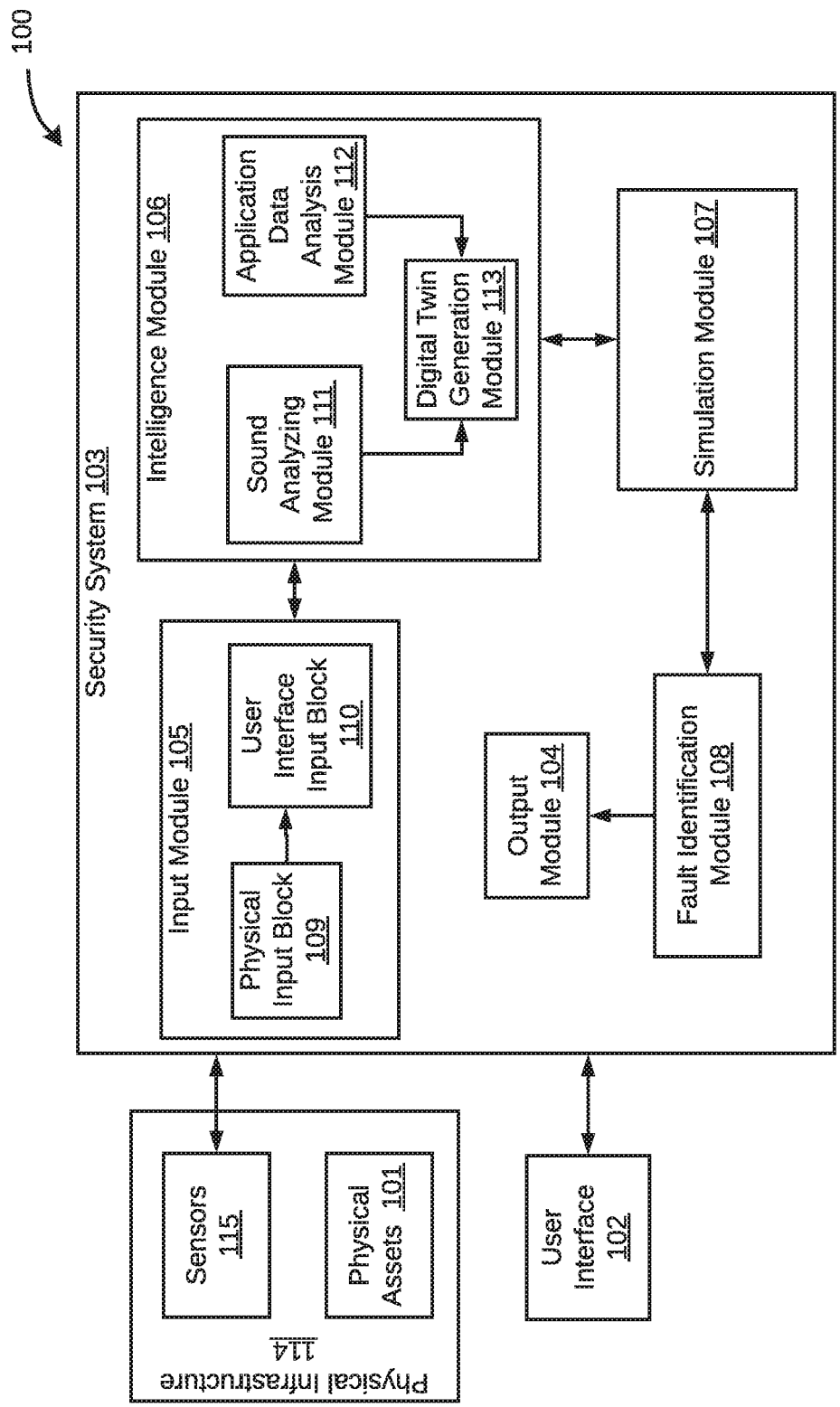
FIG. 1 is a functional block diagram of an exemplary system for providing enhanced security of physical assets within a physical infrastructure, in accordance with some embodiments of the present disclosure.

Referring now to FIG. 1, an exemplary system 100 for providing enhanced security of physical assets 101 within a physical infrastructure 114 is illustrated, in accordance with some embodiments of the present disclosure. The system 100 includes one or more physical asset(s) 101, a user interface 102, and a security system 103. As will be discussed in greater detail below, the security system 103 may include various modules to perform different operations so as to provide enhanced security of the physical asset(s) 101. In particular, the security system 103 may include an output module 104, an input module 105, an intelligence module 106, a simulation module 107, and a fault identification module 108. The input module 105 may include a physical input block 109 and a user interface input block 110. Further, the intelligence module 106 may include a sound analyzing module 111, an application data analysis module 112, and a digital twin generation module 113. Each of these modules 104-113 will be described in greater detail below.

A physical asset 101 may be any object that needs to be monitored and tracked within the physical infrastructure 114 to ensure security compliance. In some embodiments, the physical infrastructure 114 may be any building, pharmacy, store, distribution center, or an office, while the physical asset 101 may include personnel, IT devices, machines, components, or any other objects. The physical asset 101 may be simulated so as to determine an event associated with it. Such event may be a security breach related to the physical asset 101. A real time information with respect to the physical asset 101 (or any event associated with the physical asset 101) may be acquired through one or more sensors 115 installed within the physical infrastructure 114. The acquired information may be then provided to the input module 105 of the security system 103. The real time information from various sensors 115 may include acoustic signal generated by or reflected off the physical asset 101 and generated by a set of acoustic sensors, biometric readings recorded by a set of biometric sensors, RFID readings recorded by a set of RFID sensors, or camera feeds recorded by a set of cameras, and so forth. In other words, the input module 105 may receive multi-modal input with respect to the physical asset 101 from the sensors 115 installed within the physical infrastructure 114.

The user interface 102 may enable a user to provide additional inputs to the input module 105. For example, the user may provide information corresponding to the overall layout of the physical infrastructure. In some embodiments, such information may be Computer Aided Design (CAD) drawings of the overall layout. Further, for example, the user may provide information regarding the physical asset. In some embodiments, such information may include Computer aided manufacturing (CAM) drawings of the physical asset.

The input module 105 may be provided in the security system 103 for receiving multi-modal input with respect to the physical asset 101. Further, the input module 105 may provide the multi-modal input to the intelligence module 106 to identify, place, and model the physical asset 101. For example, the intelligence module 106 may analyze the acoustic signal provided by the input module 105 to identify a type of the physical asset 101. Alternatively, the input module 105 may perform initial analysis to identify the physical asset 101 before passing on the information to the intelligence module 106.

The input module 105 may include a physical input block 109 that may receive multi-modal input with respect to the physical asset 101. In an embodiment, the physical input block 109 may receive and identify the object identified based on the information associated with the object. The multi-modal input received by the physical input block 109 may include acoustic signal, biometric reading, RFID reading, etc. with respect to the physical asset 101 (e.g., stationary/moving objects within the physical infrastructure 114). Further, in some embodiments, the physical asset 101 may be identified by the physical input block 109. The physical input block 109 may feed information related to the identified physical asset 101 to the intelligence module 106. On the other hand, the user interface input block 110 may receive the information related to the overall layout of the physical infrastructure 114 or the physical asset. It should be noted that the user interface input block 110 may be configured to provide any additional information on the overall layout/map or the physical asset 101, including any additional information on the standard/mobile physical asset. Further, the user interface input block 110 transmits the overall layout of the physical infrastructure to the intelligence module 106 that is communicatively coupled to the input module 105.

The intelligence module 106 and the input module 105 may be communicatively coupled to each other. It should be noted that there may be a two-way communication between the intelligence module 106 and the input module 105 in order to transmit and receive an information. The sound analyzing module 111 (within the intelligence module 106) may receive the acoustic information related to the physical asset 101 and the overall layout of the physical infrastructure transmitted by the input module 105, respectively. For example, the sound analyzing module 111 may receive a reflection of sound or a sound wave from the object. The sound analyzing module 111 may be configured to differentiate an acoustic nature of the sound wave associated with the object from other objects present within the physical infrastructure 114 to identify an object and an individual reaction of the object. It should be noted that such analysis may be performed for each of the objects present within the physical infrastructure 114. The sound analyzing module 111 may determine a plurality of parameters including a location of the object, a movement of the object, and an angle of the object based on the analysis of the acoustic signal. Further, the plurality of parameters may be transmitted from the sound analyzing module 111 to the digital twin generation module 113.

The application data analysis module 112 (within the intelligence module 106) may be configured to analyze multi-modal input. For example, in some embodiments, the application data analysis module 112 may be configured to analyze intersection data generated by Time Difference of Arrival (TDOA) and triangulaization technique, an image of the object, a size of the object, and a location of the object received from the sound analyzing module 111. Further, the application data analysis module 112 may be configured to identify an application received from the user interface 102 and analyze the application to select an appropriate replication technique. The application may comprise historical evidences of events occurring in the physical infrastructure by the objects that may be captured to estimate and identify the inputs available for digital twin replications. Further, the application data analysis module 112 may transmit the intersection data of TDOA and triangulaization, image of the object, size of the object, and location of the object to the digital twin generation module 113.

The digital twin generation module 113 may be configured to receive an information about the plurality of parameters indicating the location of object, the movement of the object, the angle of the object from the sound analyzing module 111. After receiving the information about the plurality of parameters, the digital twin generation module 113 may map the information to an appropriate mobile asset. Additionally, the digital twin generation module 113 may be configured to receive the intersection data of TDOA and Triangulaization, the image of the object, the size of the object, and the location of the object from the application data analysis module 112. Based on the received information from the sound analyzing module 111 and the application data analysis module 112, the digital twin generation module 113 may generate a digital twin of the physical asset 101. A technique for generating the digital twin of the physical asset 101 by mapping the physical asset 101 to the digital asset may be described in greater detail in conjunction with FIGS. 5A and 5B. Further, the digital twin generation module 113 is configured to send the information of the physical asset 101 and an overall output associated with mapping to the simulation module 107.

The simulation module 107 may receive the information corresponding to the movement of the physical asset 101 and the overall output generated by the digital twin generation module 113 of the intelligence module 106. After receiving the information, the simulation module 107 maps the information to physical motions and emotions in order to decide requirement of analyzation. Here, the simulation module 107 may be configured to simulate all the physical motions and the emotions. It may be noted that the simulation module 107 may function as an event co-relation unit. Once the digital twin generation module 113 generates the events occurring in real time and maps them to digital events, the simulation module 107 may simulate the events based on threat prediction and fault identification events. The threat prediction and fault identification events may be obtained from the fault identification module 108. The simulation module 107 may generate the events and send the events to the output module 104. Therefore, the connection of the simulation module 107 to the output module 104 may help a user to view simulation of the events, occurrence of threat. Accordingly, the user may take a decision to prevent a fault based on the events occurring in the physical infrastructure. In other words, the system 100 may provide recommendations for fault prevention to the user using the output module 104.

The fault identification module 108 may be configured to receive the overall simulation analysis of whole map area of a location associated with the physical infrastructure that is under inspection from the simulation module 107. Additionally, the fault identification module 108 may receive the information related to movement of the object based on triangularization, image of the object, size of the object, and location of the object. Further, the fault identification module 108 may detect behaviors, voice, and other modulation of activities associated with the objects. Additionally, a threat analysis may be initiated by the fault identification module 108 so that an appropriate threat prevention action may be performed against an inappropriate event (for example a specific criminal activity). In an embodiment, the fault identification module 108 may employ a Machine Learning (ML) model in order to identify the threat and the patterns of the event associated with the threat. By way of an example, when an event occurs, the fault detection module 108 may refer the historical evidences corresponding to the event. Based on that the fault detection module 108 predicts presence or absence of a fault. Further, the fault identification module 108 may transmit the prediction and the fault identification events to the simulation module 107.

The output module 104 may receive the events that is to be rendered to the user from the simulation module 107. Thus, the output module 104 enables the user to view the simulation of the events, occurrence of the threat, and provides recommendations to the user for prevention of the faults.

It should be noted that the security system 103 may be implemented in programmable hardware devices such as programmable gate arrays, programmable array logic, programmable logic devices, or the like. Alternatively, the security system 103 may be implemented in software for execution by various types of processors. An identified engine/module of executable code may, for instance, include one or more physical or logical blocks of computer instructions which may, for instance, be organized as an object, module, procedure, function, or other construct. Nevertheless, the executables of an identified engine/module need not be physically located together but may include disparate instructions stored in different locations which, when joined logically together, comprise the identified engine/module and achieve the stated purpose of the identified engine/module. Indeed, an engine or a module of executable code may be a single instruction, or many instructions, and may even be distributed over several different code segments, among different applications, and across several memory devices.

In some embodiments, some part of system 100 may be easily deployed in any cloud-based servers for access and use as an 'application as a service'. For example, the security system 103 may be implemented on a cloud-based server and used for providing enhanced security of physical assets 101 within the physical infrastructure 114. In such embodiments, only the sensors 115 configured to capture data with respect to the physical asset 101 remains local to the physical infrastructure 114, while the security system 103 as well as user interface 102 may remain remote to the physical infrastructure 114.

As will be appreciated by one skilled in the art, a variety of processes may be employed for providing enhanced security of physical assets within a physical infrastructure. For example, the exemplary system 100 and associated security system, 103 may, provide enhanced security of the physical assets, by the process discussed herein. In particular, as will be appreciated by those of ordinary skill in the art, control logic and/or automated routines for performing the techniques and steps described herein may be implemented by the system 100 and the associated security system 103 either by hardware, software, or combinations of hardware and software. For example, suitable code may be accessed and executed by the one or more processors on the system 100 to perform some or all of the techniques described herein. Similarly, application specific integrated circuits (ASICs) configured to perform some or all the processes described herein may be included in the one or more processors on the system 100.

Figure 2:
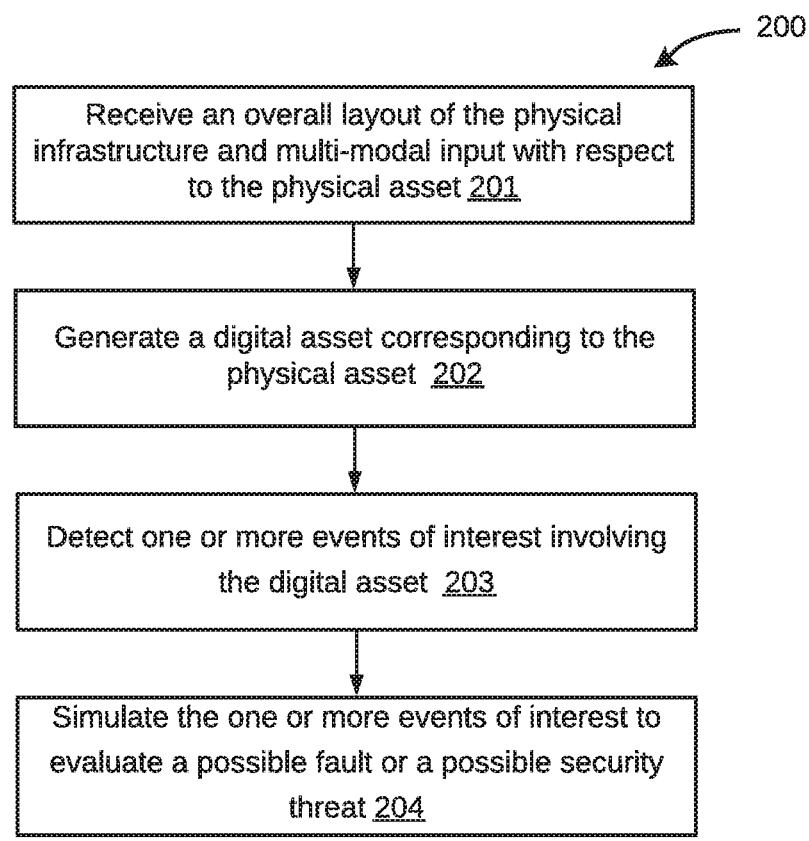
FIG. 2 is a flow diagram of an exemplary process for providing enhanced security of a physical asset within a physical infrastructure, in accordance with some embodiments of the present disclosure.

Referring now to FIG. 2, an exemplary process 200 for providing enhanced security of the physical asset within the physical infrastructure is depicted via a flowchart, in accordance with some embodiments of the present disclosure. All the steps 201 to 204 of the process 200 may be performed by employing various modules of the security system 103.

At step 201, an overall layout of the physical infrastructure and multi-modal input with respect to the physical asset 101 may be received from a plurality of sensors. The plurality of sensors may be installed at appropriate positions within the physical infrastructure. It should be noted that the multi-modal input may include acoustic signal generated by or reflected off the physical asset 101 and captured by a set of acoustic sensors. In some embodiments, the multi-modal input may further include biometric readings recorded by a set of biometric sensors, RFID readings recorded by a set of RFID sensors, camera feeds recorded by a set of cameras, and so forth. Additionally, in some embodiments, the overall layout of the physical infrastructure may include CAD drawings of the physical infrastructure or CAM drawings of the physical asset.

In some embodiments, a position of each of the set of acoustic sensors may be determined so as to generate a three-dimensional (3D) view of the physical asset 101. A first set of acoustic sensors may be placed to determine a position of the physical asset 101 using a measure of signal difference recorded by at least two of the first set of acoustic sensors. Thereafter, a position of each of a second set of acoustic sensors may be determined. The positioning of the each of a second set of acoustic sensors may be determined based on the positions of the at least two of the first set of acoustic sensors with respect to the position of the physical asset, using triangularization.

At step 202, a digital asset corresponding to the physical asset 101 may be generated. In some embodiments, the generation of the digital asset may be performed by determining an identification, a location, a shape, a size, and a behavior of the physical asset 101 based on the multi-modal input and the overall layout. It should be noted that, in some embodiments, the behavior may include at least one of a movement, a speech, an activity, a physical state, and an emotional state. Additionally, in some embodiments, the digital asset corresponding to the physical asset 101 may be generated by generating a digital twin of the physical asset 101. It may be noted that the digital twin is generated based on the location, the movement, an angle, an image, and the size of the physical asset 101.

At step 203, one or more events of interest involving the digital asset may be detected. It should be noted that the one or more events of interest may be detected based on the behavior of the physical asset 101. Further, at step 204, the one or more events of interest may be simulated in order to evaluate a possible fault or a possible security threat. For simulating the one or more events, in some embodiments, an imminent fault or an imminent security threat may be identified based on the multi-modal input using the machine learning (ML) model. However, in absence of the imminent fault or the imminent security threat, the ML model may be triggered to perform pattern recognition or to perform learning. It should be noted that the ML may be triggered to perform pattern recognition based on the multi-modal input.

In some embodiments, a recommendation or a notification may be generated based on the evaluation of the possible fault or the possible security threat. Further, in some embodiments, the evaluation may be rendered to a user via a user interface. Further, in some embodiments, the evaluation may be rendered to a user via a user interface.

Figure 3:
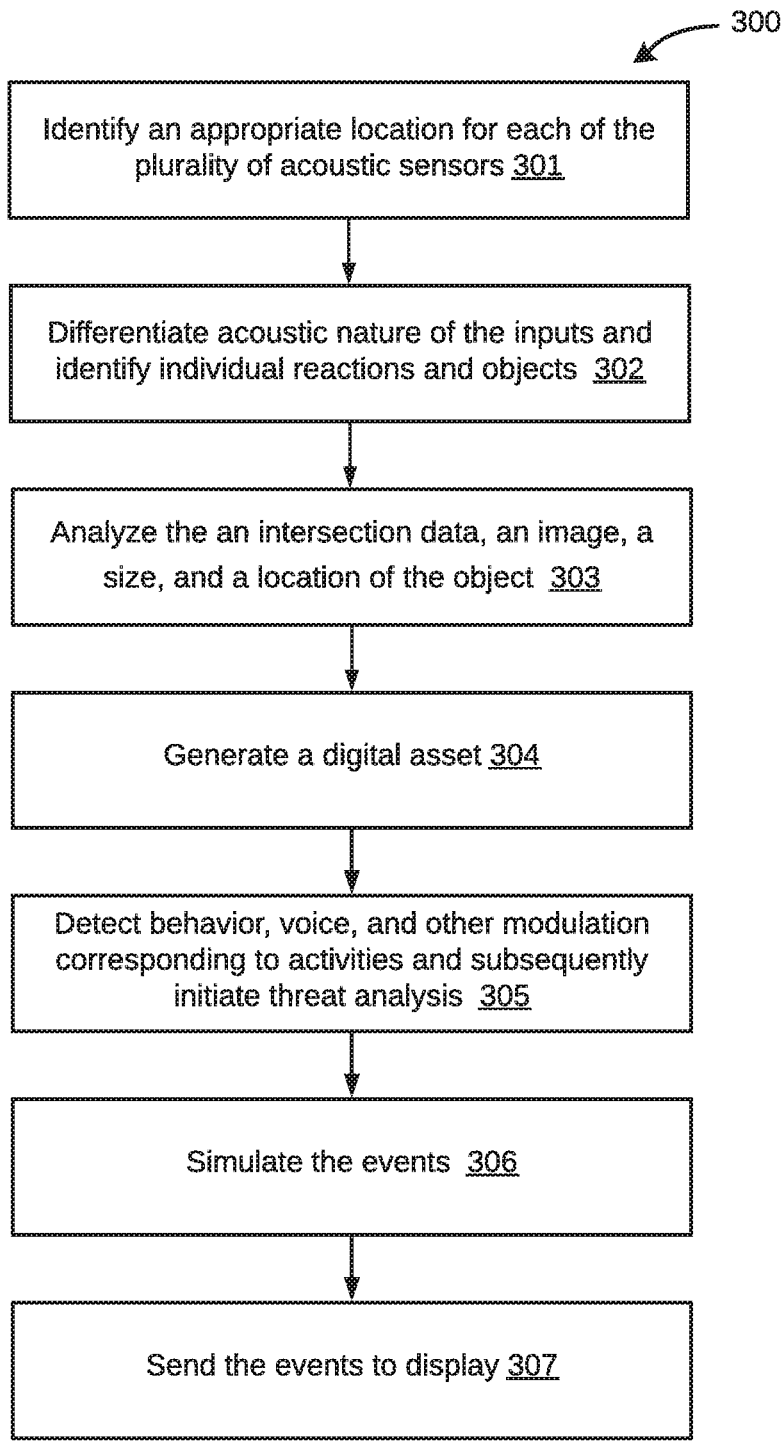
FIG. 3 is a flow diagram of a detailed exemplary process for providing enhanced security of physical assets within a physical infrastructure, in accordance with some embodiments of the present disclosure.

Referring now to FIG. 3, an exemplary process 300 for providing enhanced security of the physical asset 101 within the physical infrastructure is depicted in greater detail, via a flowchart, in accordance with some embodiments of the present disclosure. Again, all the steps from 301 to 307 of the process 300 may be performed by the security system 103.

At step 301, an appropriate location to place a plurality of acoustic devices (say, acoustic sensors) may be identified in order to capture maximum information from objects (physical assets) based on an acoustic wave generated by the objects. The identification may be performed by the input module 105.

In an embodiment, identification of the appropriate location for placing the plurality of acoustic devices may be executed based on requirement of a number of acoustic devices to transmit and receive the information along with considering time and energy aspects. The location for the acoustic device may be selected properly as the sound wave is used here to determine a distance and direction of its source or reflector. It should be noted that the location identification may be performed actively or passively and may take place in gases (such as the atmosphere), liquids (such as water), and solids (such as in the earth). The active acoustic location identification may correspond to a creation of a sound in order to produce an echo, that may be analyzed to determine the location of an object. Further, the passive acoustic location identification may correspond to detection of sound or vibration created by the object being detected, that may be analyzed to determine the location of the object.

The main aspect for the location identification may be a sound pressure as the sound is detected. The location identification may be performed by employing at least one of a particle velocity identification technique, a TDOA technique, a triangulaization technique, or any other Indirect technique in case the sound waves are reflected only from one direction. In an embodiment a combination of the TDOA technique and the Triangulaization technique may be used to identify the objects present in different directions. Here, an intersection data comprising a location as well as an angle of arrival may be obtained using the combination of the TDOA technique and the Triangularization technique. An exemplary methodology for positioning acoustic sensors based on TDOA and Triangularization technique is described in greater detail in conjunction with FIG. 4.

At step 302, an acoustic nature of the inputs may be differentiated, and individual reactions and objects may be identified, based on the information related to the physical asset and overall layout of the physical infrastructure. It should be noted that the sound analyzing module 111 may perform the step 202. The information related to the physical asset 101 may be received from the physical input block 109 and the overall layout may be received from the user interface input block 110. The sound analyzing module may receive a reflection of the sound wave. Thereafter, differentiate the acoustic nature of the inputs and helps in identifying the individual reactions and objects.

In an embodiment, the individual reactions and objects may be identified using an audio-based object recognition system for tangible acoustic interfaces. A tangible acoustic interface may be identified using the TDOA technique that may perform identification of the object based on sound waves. Additionally, in some other embodiments, individual reactions and objects ay be identified based on a reference of blind people object determination. The object may be detected by mapping sound of the object to images of the object. And, an image of the object based on the sound may be generated.

In an embodiment, a recorded raw image may be fed into an encoded string. Thereafter, a decoded matrix may be concerted to an object frame. The object frame may be then made as a sound wave. Further, an information indicating location of the object, movement of the object, the angle of the object may be transmitted.

At step 303, the intersection data of TDOA and triangulaization, image of the object, size of the object, location of the object may be analyzed to estimate a set of parameters available for digital twin replications. It should be noted that the application data analysis module 112 may analyze the intersection data of TDOA and triangulaization, image of the object, size of the object, and location of the object that may be received from the sound analyzing module 111. Further, the intersection data of TDOA and triangulaization, image of the object, size of the object, and location of the object may be transmitted to the digital twin generation module 113.

At step 304, a digital asset corresponding to the physical asset 101 may be generated based on the location of object, movement of the object, the angle of the object, image of the object, and size of the object. It should be noted that the digital twin generation module 113 performs this step. The digital asset may be generated by simulating the events occurring in real time by replication motion and physical properties. In some embodiments, the information indicating the location of object, movement of the object, the angle of the object may be received. Additionally, the intersection data of TDOA and triangulaization, image of the object, size of the object, and location of the object may also be received. In an embodiment, parameters such as identified sound pattern, arrival location, and the distance measured may be fed to the digital twin generation module 113.

Further, acoustic waves captured from sound reflection of the object (i.e., physical asst) may be fed to the digital twin generation module 113. In some embodiments, the image of the object, size of the object, and location of the object inputs along with the patterns may be fed to the digital twin generation module 113. The digital twin generation module 113 performs the data analysis by detecting source of sound, speech detection, and location corresponding to the sound using intersection data of TDOA and Triangularization. Thereafter, the output of each step (say, sound source detection, speech detection, and location detection corresponding to the sound) may be intersected. The intersection may provide a data including a sound, a pattern, and three dimensions that may result in an integrated three-dimensional (3D) view of the object. An exemplary digital twin generation module for generating a digital twin of the physical asset is described in greater detail in conjunction with FIGS. 5A and 5B. Further, the information of the physical asset and the overall output may be transmitted to the simulation module 107.

At step 305, behaviors, voice, other modulation corresponding to activities/events may be determined and subsequently a threat analysis may be generated for performing threat prevention action against an inappropriate event or a specific criminal activity, using the simulation module 107. In an embodiment, the fault identification module 108 may receive the overall simulation analysis of whole map area of the location that is under inspection from the simulation module 107. Additionally, in some embodiments, the information of the movement of the object based on triangulaization, image of the object, size of the object, and location of the object may also be received by the fault identification module 108. It should be noted that the fault identification module 108 identifies the modulation to understand the threat and isolate the location of the threat to predict and prevent the threat. Further, the threat prediction and the fault identification events may be transmitted to the simulation module 107.

At step 306, the events may be simulated based on the threat prediction and the fault identification events obtained from the fault identification module 108. In some embodiments, the simulation module 107 may draw 3D views and projects them on the visualization part. An exemplary process for threat prediction and fault identification may be explained in greater detail in conjunction with FIG. 6. At step 307, the generated events may be sent to the output module 104, wherein the events are rendered to a user. In some embodiments, the events may be generated and sent to the output module 104 so that the user may view the simulation of events, how the threat might happen, and accordingly perform fault prevention as a part of recommendations.

Figure 4:
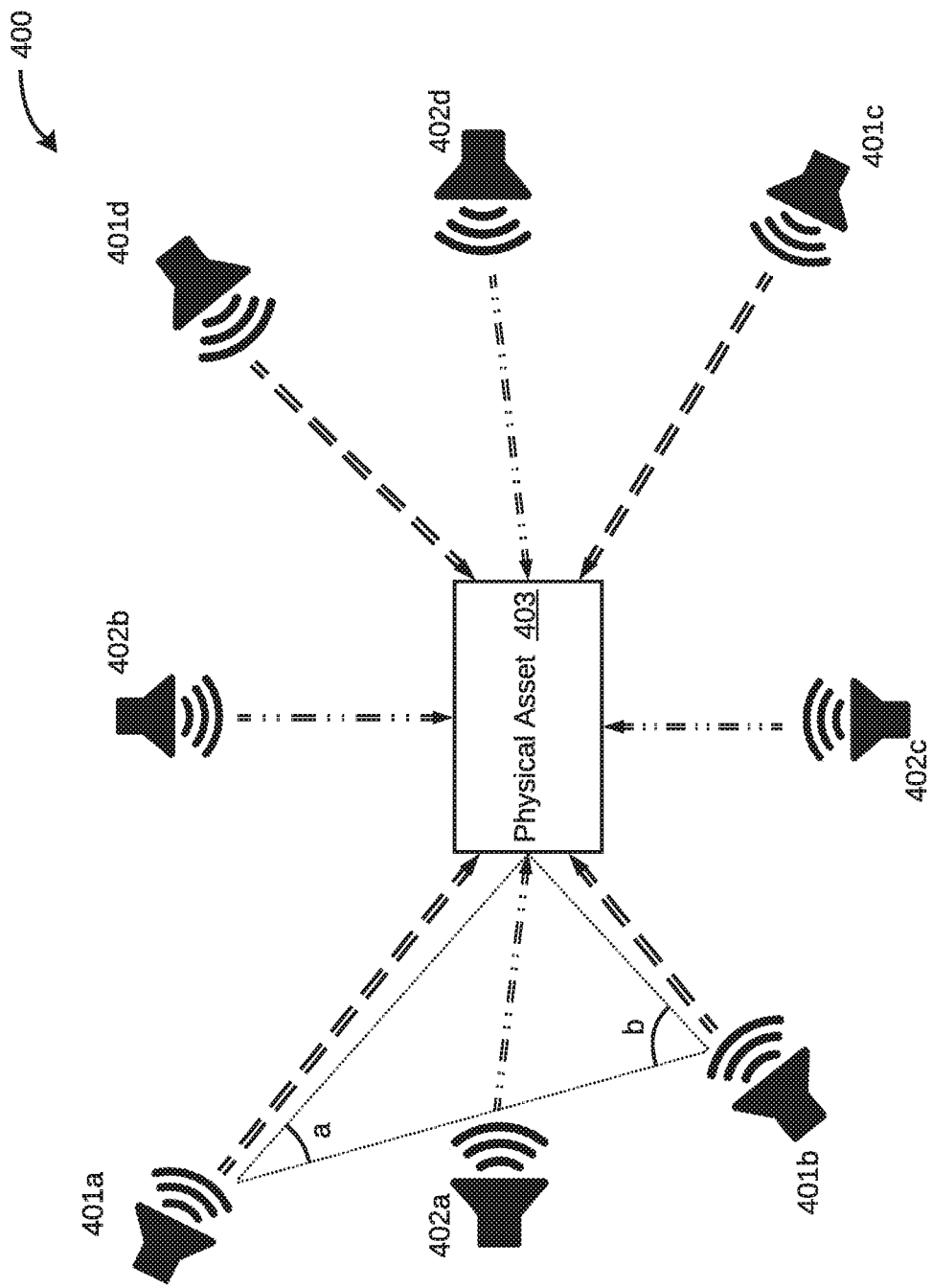
FIG. 4 is a block diagram of an exemplary methodology for positioning acoustic sensors, in accordance with some embodiments of the present disclosure.

Referring now to FIG. 4, an exemplary methodology 400 for positioning acoustic sensors is illustrated, in accordance with some embodiments of the present disclosure. The methodology 400 may include placing a first set of acoustic sensors 401a-401d within the physical infrastructure so as to determine a position of a physical asset 403 (analogous to the physical asset 101). As stated above, the position of the physical asset 403 may be determined by measuring signal difference using TDOA. In some embodiments, the signal difference is recorded by each set of two of the first set of acoustic sensors (say, 401a and 401b). An appropriate position for placing a second set of acoustic sensors 402a-402d may then be determined using Triangularization technique. In other words, positioning of each of a second set of acoustic sensors may be determined, based on positions of each set of two of the first set of acoustic sensors with respect to the position of the physical asset 403, using triangularization. Thus, positioning of an acoustic sensor 402a (belonging to the second set of acoustic sensors 402a-402d) may be determined, based on positions of the acoustic sensor 401a and the acoustic sensor 401b (belonging to the first set of acoustic sensors 401a-401d) with respect to the position of the physical asset 403, using triangularization.

By way of example, the initial measure of signal difference at two 401a and 401b of the first set of acoustic sensors 401a-401d provides an idea of the position of the physical asset 403. Thereafter, based on positions of the acoustic sensor 401a and the acoustic sensor 401b, one 402a of the second set of acoustic sensors 402a-402d may be positioned with respect to the position of the physical asset 403, using triangularization. The set of three acoustic sensor 401a,

401b, and 402a may then accurately map the physical asset 403 along with its about exact distance and about exact movement. Thus, a 3D view of the physical asset 403 may be generated, which may then be monitored and tracked.

Figure 5A:
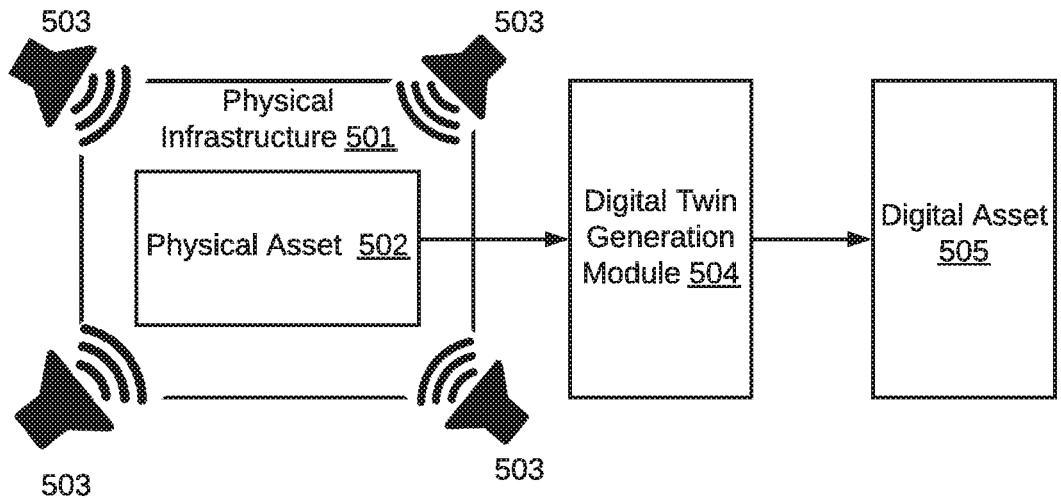
FIGS. 5A and 5B are block diagrams of an exemplary digital twin generation module for generating a digital twin of a physical asset, in accordance with some embodiments of the present disclosure.
Figure 5B:
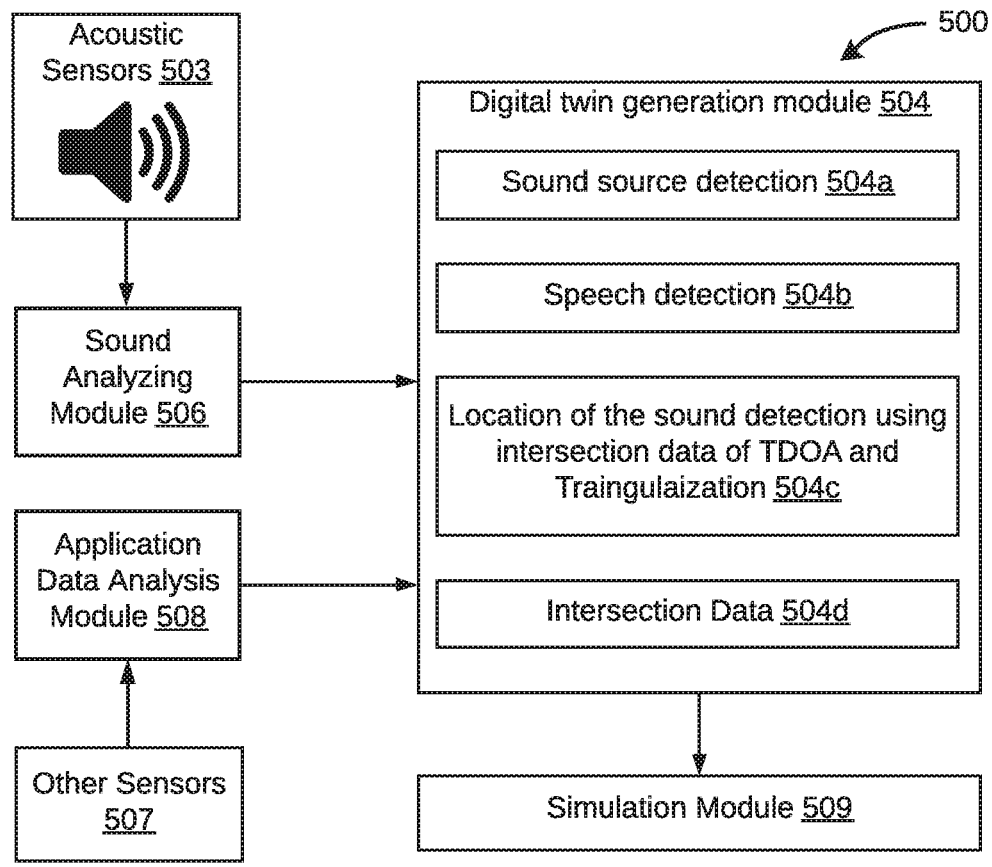

Referring now to FIGS. 5A and 5B, a block diagram of an exemplary digital twin generation module 504 (analogous to the digital twin generation module 113) for generating a digital twin of a physical asset 502 (analogous to the physical asset 101) is illustrated, in accordance with some embodiments of the present disclosure. As illustrated in FIG. 5A, a number of acoustic sensors 503 (analogous to the acoustic sensors 401a-401d and 402a-402d) is installed within the physical infrastructure 501 (analogous to the physical infrastructure 115) to capture acoustic signal generated by or reflected off the physical asset 502. The captured acoustic signal may be then provided to the digital twin generation module 504 for generating the digital twin of a physical asset 502. The digital twin is a digital asset 505 corresponding to the physical asset 502 in terms of physical appearance (i.e., shape, size, pose, etc.), physical behavior (i.e., location, movement, activity, etc.), and other behavior (i.e., speech, emotions, etc.), In other words, the digital asset 505 is an integrated 3D view of the physical asset 502 that behaves in same manner as the physical asset behaves in the real world. Thus, the digital twin generation module 504 may generate the digital asset 505 that is mapped to the physical asset 502.

Further, as illustrated in FIG. 5B, the digital twin generation module 504 may perform a number of steps 504a-504d to generate the digital asset 505 corresponding to the physical asset 502. As stated above, the digital twin generation module 504 may receive acoustic data from the acoustic sensors 503, via the sound analyzing module 507 (analogous to the sound analyzing module 111). Additionally, the digital twin generation module 504 may receive additional input data (e.g., biometric readings, RFD readings, camera feed, etc.) from other sensors 507, via the application data analysis module 508 (analogous to the application data analysis module 112). Thus, the digital twin generation module 504 may receive multi-modal inputs with respect to the physical asset 502. The digital twin generation module 504 may then perform data analysis and processing to generate the digital twin.

At step 504a, a source of sound may be identified. A sound data associated with the source may be obtained based on a data already available in the system from the acoustic sensors 501, Further, the sound source data may be obtained by matching a plurality of parameters of the sound and the source. Thereafter, at step 504b, a speech detection may be performed based on location of an object. The location of the object may be determined based on the intensity of corresponding sound wave and how the sound is received. In some embodiments, the speech detection may be performed based on spectrogram feed of a voice module and separation of the sound to identify the speech. It should be noted that the speech is an important parameter to determine emotions of the object. Further, at step 504c, the location of the object and a distance of object while moving based on the movement (for example, change in intensity of sound) of the sound may be identified. The data analysis of the object is required to be performed for 12-24 frames to make it look at a motion level so that the intersection data corresponding to the object may be obtained successfully. Further, at step 504d, the output of each of the steps 502a-502c along with additional data received from the application data analysis module 508 may be intersected. The result may include the integrated 3D view of the physical asset 502 representing a sound, a pattern, a movement, and a 3D view of the physical asset. The integrated 3D view of the physical asset 502 (i.e., the digital asset 505) may be further provided to the simulation module 509 for subsequent processing.

Figure 6:
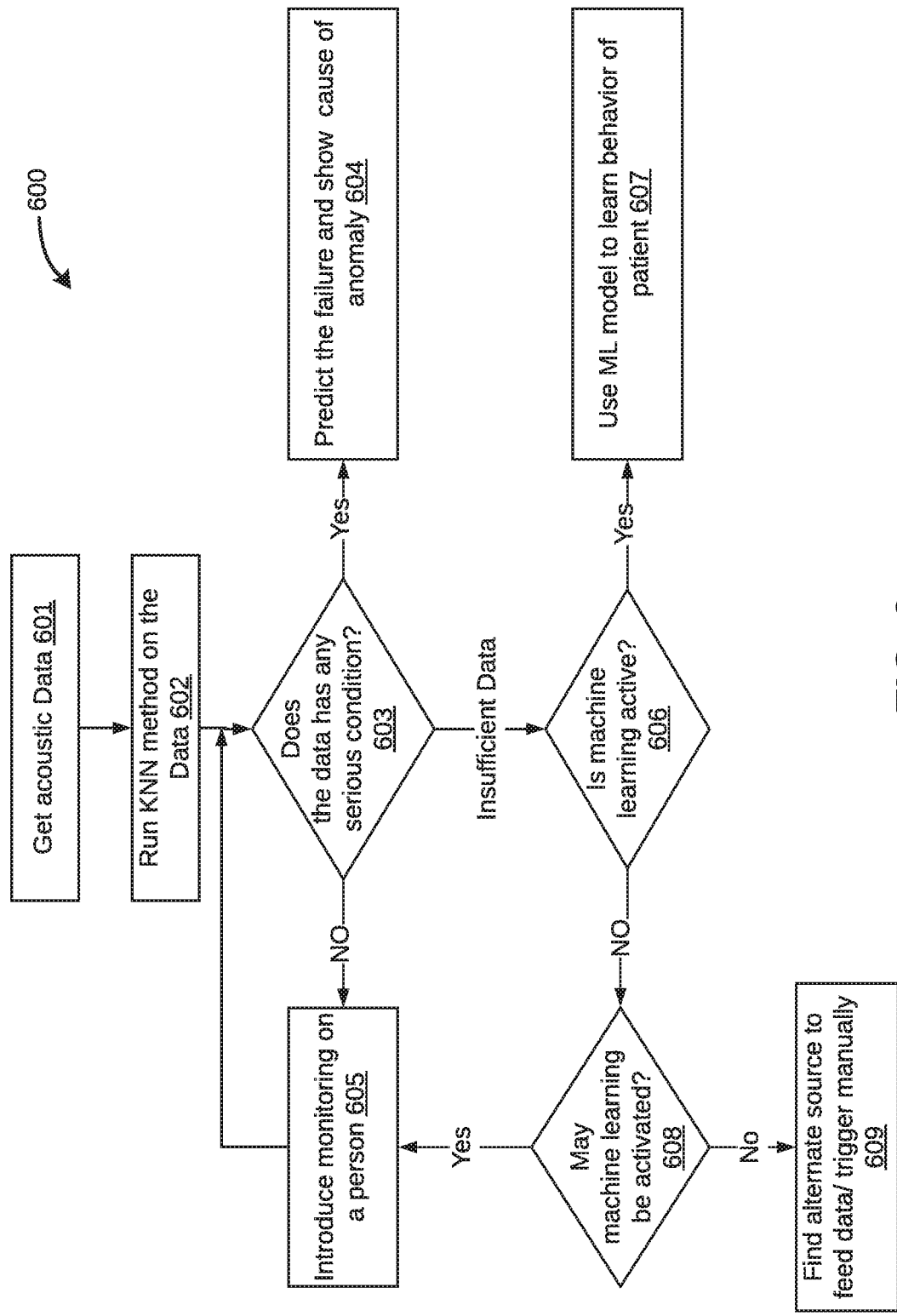
FIG. 6 is a flow diagram of an exemplary process for threat prediction and fault identification, in accordance with some embodiments of the present disclosure.

Referring now to FIG. 6, an exemplary process for threat prediction and fault identification is depicted via a flowchart, in accordance with some embodiments of the present disclosure. At step 601, an acoustic data may be gathered based on inputs of a sound wave that are fed to the security system 103. Further at step 602, the security system 103 may trigger a K-Nearest Neighbors (KNN) model. At step 603, condition of the data may be checked whether the condition is serious or not. In other words, it is checked whether there are any imminent threats that needs to be treated or not. When the serious condition of data is encountered, the process jumps to a step 604, wherein a failure and cause of an anomaly may be predicted. On the other hand, when there is no serious condition is found then the step 605 may be performed. At the step 605, a person may be monitored and then again, the step 603 may be performed.

In case, the data for checking the condition is insufficient, then the process may jump to a step 606, where an activation of the ML model may be checked. At step 607, when a positive result is generated in the step 606, behavior of a patient (say, the physical asset 101, 406, or the object) may be learnt using the ML model. In some embodiments, a pattern recognition may be performed. Further, when the ML model is not activated, then the security system 103 may check whether the activation of the ML model is feasible or not. At step 609, when the feasibility condition of activation of the ML model is not fulfilled then an alternate source for feeding data or manual triggering detected. In case the activation of the ML model is found feasible then the process 600 performs the step 605 again.

The present disclosure may provide many advantages in order to overcome the problems encountered in conventional systems and methods. As discussed above, conventional techniques lack in predicting the failures before they happen. Also, the conventional techniques lack in preventing the predicted failures dynamically without any human intervention. In contrast, the present disclosure ensures a two-factor authentication and introduces a multi-level security system which improves security of an associated physical infrastructure without any human intervention. Additionally, the security system arrests internal failures associated with the physical infrastructure effectively and isolates an infected part in order to prevent remaining sections from failure. Further, the proposed disclosure provides overall improved performance by auto-detection, prediction, and prevention of failures, and hence increases reliability and reduces risk of failures.

In light of the above-mentioned advantages and the technical advancements provided by the disclosed method and system, the claimed steps as discussed above are not routine, conventional, or well understood in the art, as the claimed steps enable the following solutions to the existing problems in conventional technologies. Further, the claimed steps clearly bring an improvement in the functioning of the system itself as the claimed steps provide a technical solution to a technical problem.

Figure 7:
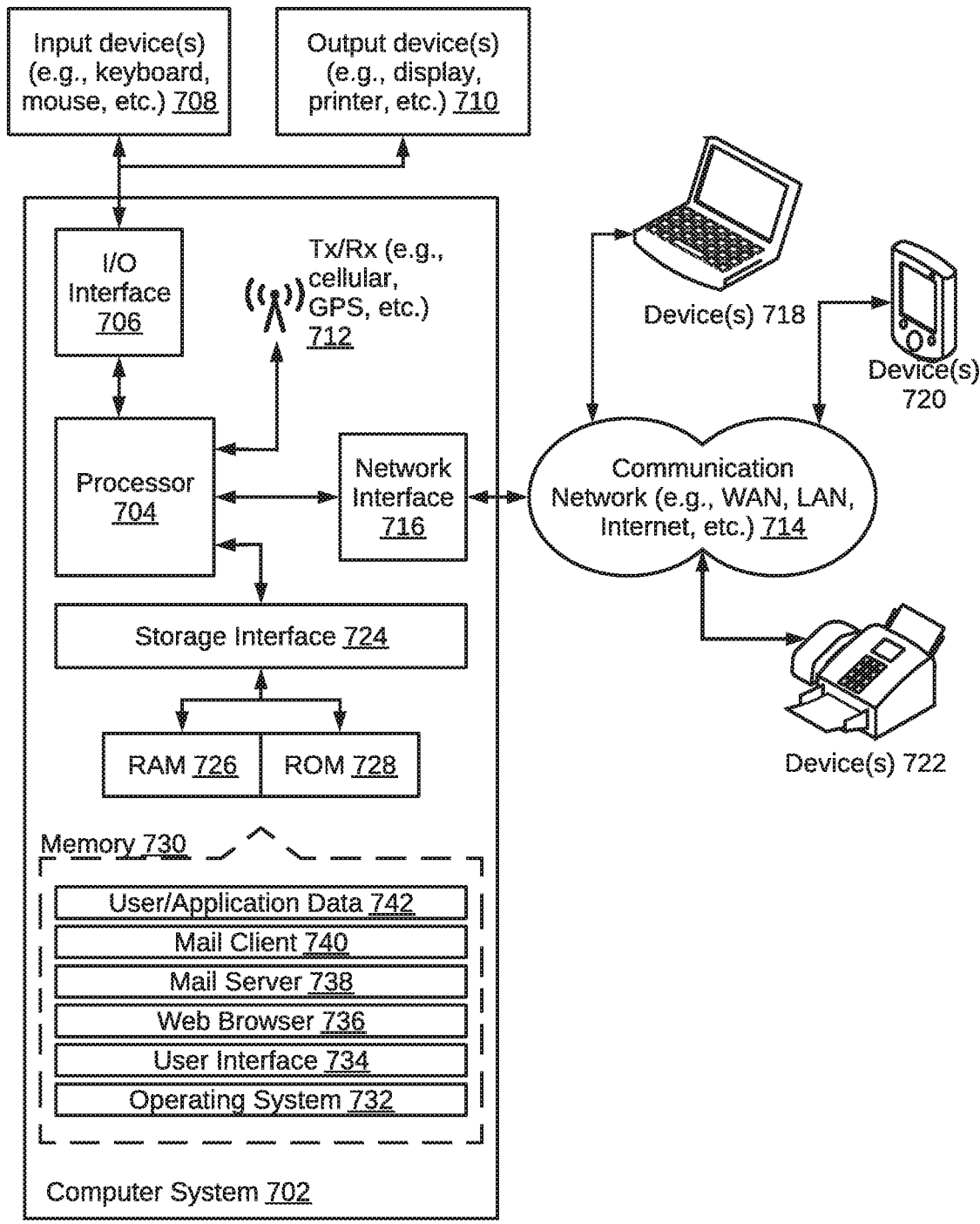
FIG. 7 illustrates a block diagram of an exemplary computer system for implementing embodiments consistent with the present disclosure.

The disclosed methods and systems may be implemented on a conventional or a general-purpose computer system, such as a personal computer (PC) or server computer. Referring now to FIG. 7, a block diagram of an exemplary computer system 702 for implementing various embodiments is illustrated. Computer system 702 may include a central processing unit ("CPU" or "processor") 704. Processor 704 may include at least one data processor for executing program components for executing user-generated or system-generated requests. A user may include a person, a person using a device such as such as those included in this disclosure, or such a device itself, Processor 704 may include specialized processing units. Such as integrated system (bus) controllers, memory management control units, floating point units, graphics processing units, digital signal processing units, etc. Processor 704 may include a microprocessor, such as AMD® ATHLON® microprocessor, DURON® microprocessor OR OPTERON® microprocessor, ARM's application, embedded or secure processors, IBM® POWERPC®, INTEL'S CORE® processor, ITANIUM® processor, XEON® processor, CELERON® processor or other line of processors, etc. Processor 704 may be implemented using mainframe, distributed processor, multi-core, parallel, grid, or other architectures. Some embodiments may utilize embedded technologies like application-specific integrated circuits (ASICs), digital signal processors (DSPs), Field Programmable Gate Arrays (FPGAs), etc.

Processor 704 may be disposed in communication with one or more input/output (I/O) devices via an I/O interface 706. I/O interface 706 may employ communication protocols/methods such as, without limitation, audio, analog, digital, monoaural, RCA, stereo, IEEE-1394, serial bus, universal serial bus (USB), infrared, PS/2, BNC, coaxial, component, composite, digital visual interface (DVI), high-definition multimedia interface (HDMI), RF antennas, S-Video, VGA, IEEE 802.n/b/g/n/x, Bluetooth, cellular (for example, code-division multiple access (CDMA), high-speed packet access (HSPA+), global system for mobile communications (GSM), long-term evolution (LTE), WiMax, or the like), etc.

Using I/O interface 706, computer system 702 may communicate with one or more I/O devices. For example, an input device 708 may be an antenna, keyboard, mouse, joystick, (infrared) remote control, camera, card reader, fax machine, dangle, biometric reader, microphone, touch screen, touchpad, trackball, sensor (for example, accelerometer, light sensor, GPS, gyroscope, proximity sensor, or the like), stylus, scanner, storage device, transceiver, video device/source, visors, etc. An output device 710 may be a printer, fax machine, video display (for example, cathode ray tube (CRT), liquid crystal display (LCD), light-emitting diode (LED), plasma, or the like), audio speaker, etc. In some embodiments, a transceiver 712 may be disposed in connection with processor 704. Transceiver 712 may facilitate various types of wireless transmission or reception. For example, transceiver 712 may include an antenna operatively connected to a transceiver chip (for example, TEXAS® INSTRUMENTS WILINK WL1286® transceiver, BROADCOM® BCM4550IUB8® transceiver, INFINEON TECHNOLOGIES® X-GOLD 718-PMB9800® transceiver, or the like), providing IEEE 802.6a/b/g/n, Bluetooth, FM, global positioning system (GPS), 2G/3G HSDPA/HSUPA communications, etc.

In some embodiments, processor 704 may be disposed in communication with a communication network 714 via a network interface 716. Network interface 716 may communicate with communication network 714. Network interface 716 may employ connection protocols including, without limitation, direct connect, Ethernet (for example, twisted pair 50/500/5000 Base T), transmission control protocol/internet protocol (TCP/IP), token ring, IEEE 802.11a/b/g/n/x, etc. Communication network 714 may include, without limitation, a direct interconnection, local area network (LAN), wide area network (WAN), wireless network (for example, using Wireless Application Protocol), the Internet, etc. Using network interface 716 and communication network 714, computer system 702 may communicate with devices 718, 720, and 722. These devices may include, without limitation, personal computer(s), server(s), fax machines, printers, scanners, various mobile devices such as cellular telephones, smartphones (for example, APPLE® IPHONE® smartphone, BLACKBERRY® smartphone, ANDROID® based phones, etc.), tablet computers, eBook readers (AMAZON® KINDLE® e-reader, NOOK® tablet computer, etc.), laptop computers, notebooks, gaming consoles (MICROSOFT® XBOX® gaming console, NINTENDO® DS® gaming console, SONY® PLAYSTATION® gaming console, etc.), or the like. In some embodiments, computer system 702 may itself embody one or more of these devices.

In some embodiments, processor 704 may be disposed in communication with one or more memory devices (for example, RAM 726, ROM 728, etc.) via a storage interface 724. Storage interface 724 may connect to memory 730 including, without limitation, memory drives, removable disc drives, etc., employing connection protocols such as serial advanced technology attachment (SATA), integrated drive electronics (IDE), IEEE-1394, universal serial bus (USB), fiber channel, small computer systems interface (SCSI), etc. The memory drives may further include a drum, magnetic disc drive, magneto-optical drive, optical drive, redundant array of independent discs (RAID), solid-state memory devices, solid-state drives, etc.

Memory 730 may store a collection of program or database components, including, without limitation, an operating system 732, user interface application 734, web browser 736, mail server 738, mail client 740, user/application data 742 (for example, any data variables or data records discussed in this disclosure), etc. Operating system 732 may facilitate resource management and operation of computer system 702, Examples of operating systems 732 include, without limitation, APPLE® MACINTOSH® OS X platform, UNIX platform, Unix-like system distributions (for example, Berkeley Software Distribution (BSD), FreeBSD, NetBSD, OpenBSD, etc.), LINUX distributions (for example, RED HAT®, UBUNTU®, KUBUNTU®, etc.), IBM® OS/2 platform, MICROSOFT® WINDOWS® platform (XP, Vista/7/8, etc.), APPLE® IOS® platform, GOOGLE® ANDROID® platform, BLACKBERRY® OS platform, or the like. User interface 734 may facilitate display, execution, interaction, manipulation, or operation of program components through textual or graphical facilities. For example, user interfaces may provide computer interaction interface elements on a display system operatively connected to computer system 702, such as cursors, icons, check boxes, menus, scrollers, windows, widgets, etc. Graphical user interfaces (GUIs) may be employed, including, without limitation, APPLE® Macintosh® operating systems' AQUA® platform, IBM® OS/2® platform, MICROSOFT® WINDOWS® platform (for example, AERO® platform, METRO® platform, etc.), UNIX X-WINDOWS, web interface libraries (for example, ACTIVEX® platform, JAVA® programming language, JAVASCRIPT® programming language, AJAX'® programming language, HTML, ADOBE® FLASH® platform, etc.), or the like.

In some embodiments, computer system 702 may implement a web browser 736 stored program component. Web browser 736 may be a hypertext viewing application, such as MICROSOFT® INTERNET EXPLORER® web browser, GOGGLE® CHROME® web browser, MOZILLA® FIREFOX® web browser, APPLE® SAFARI® web browser, etc. Secure web browsing may be provided using HTTPS (secure hypertext transport protocol), secure sockets layer (SSL), Transport Layer Security (TLS), etc. Web browsers may utilize facilities such as AJAX, DHTML, ADOBE® FLASH® platform, JAVASCRIPT® programming language, JAVA® programming language, application programming interfaces (APIs), etc. In some embodiments, computer system 702 may implement a mail server 738 stored program component. Mail server 738 may be an Internet mail server such as MICROSOFT® EXCHANGE® mail server, or the like. Mail server 738 may utilize facilities such as ASP, ActiveX, ANSI C++/C #, MICROSOFT .NET® programming language, CGI scripts, JAVA® programming language, JAVASCRIPT® programming language, PERL® programming language, PHP® programming language, PYTHON® programming language, WebObjects, etc. Mail server 738 may utilize communication protocols such as internet message access protocol (IMAP), messaging application programming interface (MAPI), Microsoft Exchange, post office protocol (POP), simple mail transfer protocol (SMTP), or the like. In some embodiments, computer system 702 may implement a mail client 740 stored program component. Mail client 740 may be a mail viewing application, such as APPLE MAIL® mail client, MICROSOFT ENTOURAGE® mail client, MICROSOFT OUTLOOK® mail client, MOZILLA THUNDERBIRD® mail client, etc.

In some embodiments, computer system 702 may store user/application data 742, such as the data, variables, records, etc. as described in this disclosure. Such databases may be implemented as fault-tolerant, relational, scalable, secure databases such as ORACLE® database OR SYBASE® database. Alternatively, such databases may be implemented using standardized data structures, such as an array, hash, linked list, struct, structured text file (for example, XML), table, or as object-oriented databases (for example, using OBJECTSTORE® object database, POET® object database, ZOPE® object database, etc.). Such databases may be consolidated or distributed, sometimes among the various computer systems discussed above in this disclosure. It is to be understood that the structure and operation of the any computer or database component may be combined, consolidated, or distributed in any working combination.

It will be appreciated that, for clarity purposes, the above description has described embodiments of the invention with reference to different functional units and processors. However, it will be apparent that any suitable distribution of functionality between different functional units, processors or domains may be used without detracting from the invention. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

The specification has described method and system for providing enhanced security of a physical asset within a physical infrastructure. The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope and spirit of disclosed embodiments being indicated by the following claims.

What is claimed is:

1. A method of providing enhanced security of a physical asset within a physical infrastructure, the method comprising:

receiving, by a security system, an overall layout of the physical infrastructure and multi-modal input with respect to the physical asset from a plurality of sensors installed within the physical infrastructure, wherein the multi-modal input comprises acoustic signal generated by or reflected off the physical asset and captured by a set of acoustic sensors;

generating, by the security system, a digital asset corresponding to the physical asset by determining an identification, a location, a shape, a size, and a behavior of the physical asset based on the multi-modal input and the overall layout, wherein generating the digital asset corresponding to the physical asset comprises generating a digital twin of the physical asset based on the location, a movement, an angle, an image, and the size of the physical asset;

detecting, by the security system, one or more events of interest involving the digital asset based on the behavior of the physical asset; and simulating, by the security system, the one or more events of interest to evaluate a possible fault or a possible security threat.

2. The method of claim 1, further comprising at least one of:

generating at least one of a recommendation or a notification based on the evaluation; or rendering the evaluation to a user via a user interface.

3. The method of claim 1, wherein the multi-modal input further comprises at least one of biometric readings recorded by a set of biometric sensors, RFID readings recorded by a set of RFID sensors, or camera feeds recorded by a set of cameras, and wherein the overall layout of the physical infrastructure comprises at least one of computer aided design (CAD) drawings of the physical infrastructure and computer aided manufacturing (CAM) drawings of the physical asset.

4. The method of claim 1, wherein the behavior comprises at least one of a movement, a speech, an activity, a physical state, and an emotional state.

5. The method of claim 1, further comprising determining a positioning of each of the set of acoustic sensors to generate a three-dimensional view of the physical asset by:
placing a first set of acoustic sensors to determine a position of the physical asset using a measure of signal difference recorded by at least two of the first set of acoustic sensors; and
positioning each of a second set of acoustic sensors, based on positions of the at least two of the first set of acoustic sensors with respect to the position of the physical asset, using triangularization.

6. The method of claim 1, wherein simulating the one or more events comprises:
identifying an imminent fault or an imminent security threat based on the multi-modal input using a machine learning model; and
in absence of the imminent fault or the imminent security threat, triggering the machine learning model to perform pattern recognition based on the multi-modal input or to perform learning.

7. A system for providing enhanced security of a physical asset within a physical infrastructure, the system comprising:
a processor; and
a memory communicatively coupled to the processor, wherein the memory stores processor-executable instructions, which, on execution, causes the processor to:
receive an overall layout of the physical infrastructure and multi-modal input with respect to the physical asset from a plurality of sensors installed within the physical infrastructure, wherein the multi-modal input comprises acoustic signal generated by or reflected off the physical asset and captured by a set of acoustic sensors;
generate a digital asset corresponding to the physical asset by determining an identification, a location, a shape, a size, and a behavior of the physical asset based on the multi-modal input and the overall layout, wherein generating the digital asset corresponding to the physical asset comprises generating a digital twin of the physical asset based on the location, a movement, an angle, an image, and the size of the physical asset;
detect one or more events of interest involving the digital asset based on the behavior of the physical asset; and
simulate the one or more events of interest to evaluate a possible fault or a possible security threat.

8. The system of claim 7, wherein the processor-executable instructions further cause the processor to, at least one of:
generate at least one of a recommendation or a notification based on the evaluation; or
render the evaluation to a user via a user interface.

9. The system of claim 7, wherein the multi-modal input further comprises at least one of biometric readings recorded by a set of biometric sensors, RFD readings recorded by a set of RFID sensors, or camera feeds recorded by a set of cameras, and wherein the overall layout of the physical infrastructure comprises at least one of computer aided design (CAD) drawings of the physical infrastructure and computer aided manufacturing (CAM) drawings of the physical asset.

10. The system of claim 7, wherein the behavior comprises at least one of a movement, a speech, an activity, a physical state, and an emotional state.

11. The system of claim 7, wherein the processor-executable instructions further cause the processor to determine a positioning of each of the set of acoustic sensors to generate a three-dimensional view of the physical asset by:
placing a first set of acoustic sensors to determine a position of the physical asset using a measure of signal difference recorded by at least two of the first set of acoustic sensors; and
positioning each of a second set of acoustic sensors, based on positions of the at least two of the first set of acoustic sensors with respect to the position of the physical asset, using triangularization.

12. The system of claim 7, wherein the processor simulates the one or more events by:
identifying an imminent fault or an imminent security threat based on the multi-modal input using a machine learning model; and
in absence of the imminent fault or the imminent security threat, triggering the machine learning algorithm to perform pattern recognition based on the multi-modal input or to perform learning.

13. A non-transitory computer-readable medium, for providing enhanced security of a physical asset within a physical infrastructure, having stored thereon, a set of computer-executable instructions causing a computer comprising one or more processors to perform steps comprising:
receiving an overall layout of the physical infrastructure and multi-modal input with respect to the physical asset from a plurality of sensors installed within the physical infrastructure; wherein the multi-modal input comprises acoustic signal generated by or reflected off the physical asset and captured by a set of acoustic sensors;
generating a digital asset corresponding to the physical asset by determining an identification, a location, a shape, a size, and a behavior of the physical asset based on the multi-modal input and the overall layout, wherein generating the digital asset corresponding to the physical asset comprises generating a digital twin of the physical asset based on the location, a movement, an angle, an image, and the size of the physical asset;
detecting one or more events of interest involving the digital asset based on the behavior of the physical asset; and
simulating the one or more events of interest to evaluate a possible fault or a possible security threat.

14. The non-transitory computer-readable medium of claim 13, further causing the computer to perform steps comprising, at least one of:
generating at least one of a recommendation or a notification based on the evaluation; or
rendering the evaluation to a user via a user interface.

15. The non-transitory computer-readable medium of claim 13, wherein the behavior comprises at least one of a movement, a speech, an activity, a physical state; and an emotional state.

16. The non-transitory computer-readable medium of claim 13, further causing the computer to perform steps comprising determining a positioning of each of the set of acoustic sensors to generate a three-dimensional view of the physical asset by:
placing a first set of acoustic sensors to determine a position of the physical asset using a measure of signal difference recorded by at least two of the first set of acoustic sensors; and positioning each of a second set of acoustic sensors, based on positions of the at least two of the first set of acoustic sensors with respect to the position of the physical asset, using triangularization.

17. The non-transitory computer-readable medium of claim 13, wherein simulating the one or more events comprises:
identifying an imminent fault or an imminent security threat based on the multi-modal input using a machine learning model; and
in absence of the imminent fault or the imminent security threat, triggering the machine learning algorithm to perform pattern recognition based on the multi-modal input or to perform learning.

* * * * *